(12) United States Patent
Tanabe et al.

(10) Patent No.: US 7,141,814 B2
(45) Date of Patent: Nov. 28, 2006

(54) INPUT CIRCUIT

(75) Inventors: Yoshihiro Tanabe, Moriya (JP);
Shigeharu Oide, Adachi-ku (JP)

(73) Assignee: SMC Kabushiki Kaisha, Tokyo (JP)

( * ) Notice: Subject to any disclaimer, the term of this patent is extended or adjusted under 35 U.S.C. 154(b) by 83 days.

(21) Appl. No.: 10/979,130

(22) Filed: Nov. 3, 2004

(65) Prior Publication Data

US 2005/0098743 A1   May 12, 2005

(30) Foreign Application Priority Data

Nov. 10, 2003   (JP)   ............... 2003-379640

(51) Int. Cl.
*G02B 27/00* (2006.01)
*H01J 40/14* (2006.01)

(52) U.S. Cl. .................. 250/551; 327/514

(58) Field of Classification Search ............ 250/551, 250/214 R; 327/514, 515; 323/223, 282; 363/74, 80

See application file for complete search history.

(56) References Cited

U.S. PATENT DOCUMENTS 6,169,491 B1 *   1/2001   McDonald ............ 340/815.4

FOREIGN PATENT DOCUMENTS

JP      07295608 A   * 11/1995
JP      10-247846      9/1998

* cited by examiner

*Primary Examiner*—Kevin Pyo
(74) *Attorney, Agent, or Firm*—Paul A. Guss

(57) ABSTRACT

An input circuit has a first current-limiting resistor, a second current-limiting resistor, and an AC-input photocoupler. The photocoupler has an input terminal connected to a first external terminal and another input terminal connected to a positive electrode through the first current-limiting resistor and also to a ground electrode through the second current-limiting resistor. The first external terminal is connected to a PNP transistor and NPN transistors.

8 Claims, 3 Drawing Sheets

INPUT CIRCUIT

BACKGROUND OF THE INVENTION

1. Field of the Invention

The present invention relates to an input circuit for connection to an NPN switching element and a PNP switching element.

2. Description of the Related Art

On/off sensors such as proximity switches or the like employ a transistor as a switching element and have an output circuit with an open collector of the transistor. Since transistors are available as NPN and PNP transistors, input circuits of devices to which proximity switches are connected should preferable be connectable to both NPN and PNP transistors. For example, there has been proposed an input circuit 100 as shown in FIG. 3A of the accompanying drawings.

As shown in FIG. 3A, the input circuit 100 includes an AC (Alternating Current)-input photocoupler 102 having an input terminal 102a connected through a resistor 104 to an external terminal 106a and another input terminal 102b connected to an external terminal 106b. The input circuit 100 also has a resistor 108 connected between the input terminals 102a, 102b parallel thereto.

For connecting an NPN transistor 110 as a switching element to the input circuit 100, the collector of the transistor 110 is connected to the external terminal 106a and the emitter thereof is connected to ground G, and a positive electrode V is connected to the external terminal 106b.

As shown in FIG. 3B of the accompanying drawings, for connecting a PNP transistor 112 as a switching element to the input circuit 100, the collector of the transistor 112 is connected to the external terminal 106a and the emitter thereof is connected to the positive electrode V, the external terminal 106b is connected to ground G.

There has also been proposed an input circuit using both NPN and PNP transistors for the purpose of increasing the input range thereof (see, for example, Japanese laid-open patent publication No. 10-247846).

The input circuit 100 shown in FIGS. 3A and 3B, allows either the NPN transistor 110 or the PNP transistor 112 to be connected thereto, but prevent both the NPN transistor 110 and the PNP transistor 112 from being simultaneously connected thereto.

The external terminal 106b needs to be selectively connected to the positive electrode V and ground G when the NPN transistor 110 is connected and when the PNP transistor 112 is connected.

The input circuit disclosed in Japanese laid-open patent publication No. 10-247846 is of a simple arrangement. The NPN transistor and the PNP transistor in the disclosed input circuit operate as an emitter follower, and are not switching elements to be connected through external circuits. Therefore, the input circuit cannot be used as an input circuit for external switching elements.

SUMMARY OF THE INVENTION

It is therefore an object of the present invention to provide an input circuit of simple arrangement for allowing an NPN switching element and a PNP switching element to be connected simultaneously thereto.

An input circuit according to the present invention has a first external terminal for connection to at least one switching element, a first resistor and a second resistor, and a photocoupler having a first input terminal and a second input terminal for receiving an AC input, the first input terminal being connected to the first external terminal, the second input terminal being connected to a first polarity electrode of a power supply through the first resistor and to a second polarity electrode of the power supply through the second resistor.

The input circuit thus constructed allows both NPN and PNP switching elements to be simultaneously connected thereto as the switching elements for connection to the first external terminal. The input circuit is of a simple arrangement having the first external terminal, the first resistor, the second resistor, and the AC-input photocoupler as basic components.

The input circuit may further include a second external terminal and a third external terminal for connection to the switching element, the first polarity electrode of the power supply being connected to the second external terminal, and the second polarity electrode of the power supply being connected to the third external terminal.

The first resistor and the second resistor may preferably have respective resistances equal to each other.

The power supply may comprise an insulative power supply.

The input circuit may further include a bypass resistor connected between the first input terminal and the second input terminal.

The photocoupler may comprise two LEDs having respective anodes and cathodes connected parallel in opposite directions.

The input circuit may be incorporated in an input unit of a controller.

The first external terminal may be connected to proximity switches, pressure switches, or flow rate switches as the switching elements.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1:
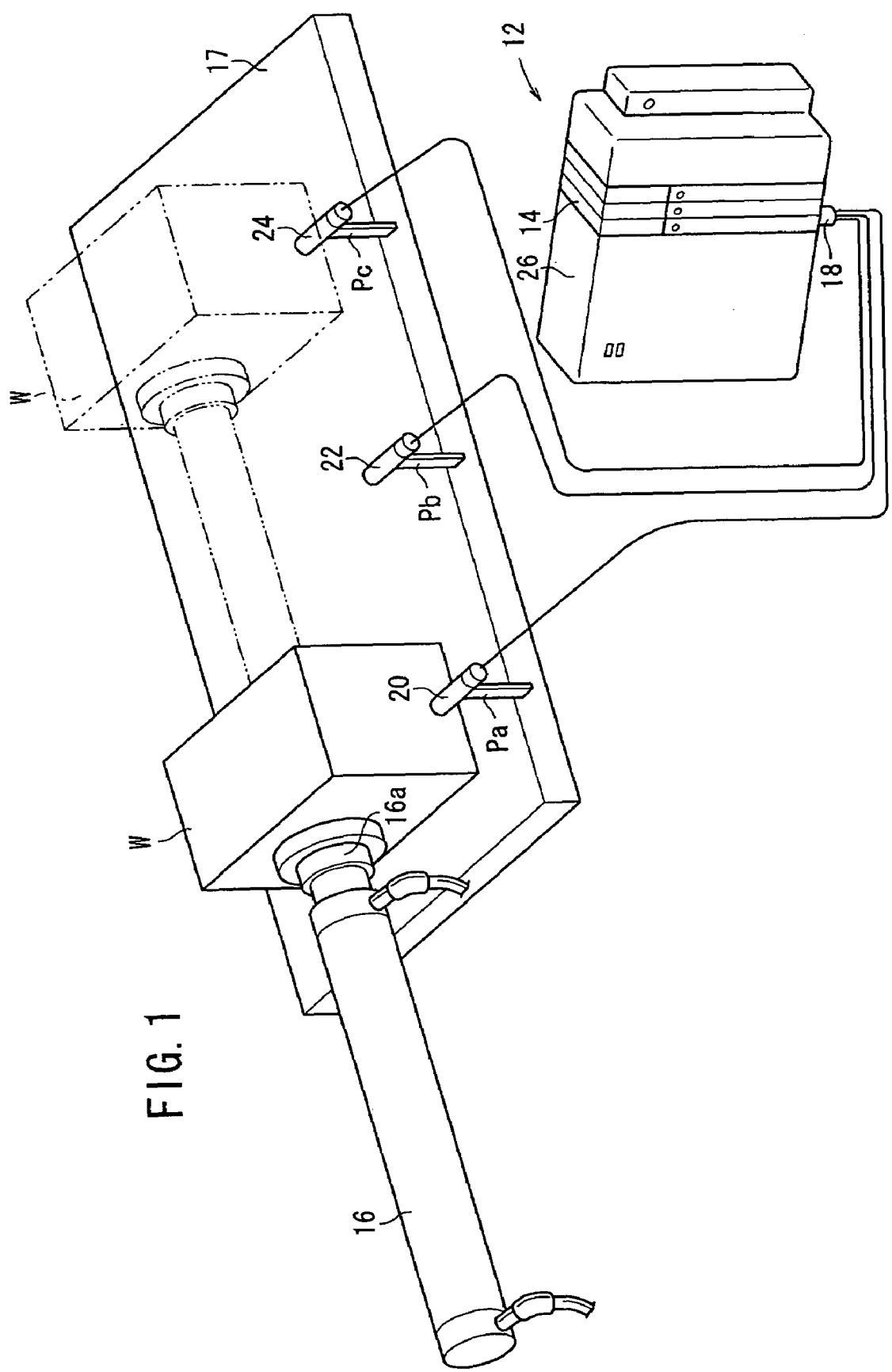
FIG. 1 is a perspective view of a controller incorporating an input circuit according to an embodiment of the present invention, a workpiece to be positionally detected by the controller, and a cylinder for displacing the workpiece.

An input circuit 10 (see FIG. 2) according to an embodiment of the present invention is incorporated in an input unit 14 of a controller 12 shown in FIG. 1.

As shown in FIG. 1, the controller 12 serves to detect the position of a workpiece W that is displaced on a table 17 by a cylinder 16. The input unit 14 is connected to three proximity switches 20, 22, 24 on the table 17 by a connector 18.

After the workpiece W is placed in a first position Pa, the workpiece W is pushed by a piston rod 16a of the cylinder 16, and displaced through an intermediate position Pb to a final position Pc. The proximity switches 20, 22, 24 are located respectively in the positions Pa, Pb, Pc. The proximity switches 20, 22, 24 detect the workpiece W as it moves across the front ends thereof, and transmit respective detected signals to the input unit 14. Each of the distances between the positions Pa, Pb, Pc is greater than the width of the workpiece W such that two or more of the proximity switches 20, 22, 24 will not simultaneously be turned on by the workpiece W.

The controller 12 has a main unit 26 for performing a predetermined processing sequence based on a signal from the input unit 14. For performing the predetermined processing sequence, the main unit 26 may be able to detect when the workpiece W is located in either one of the positions Pa, Pb, Pc, i.e., the main unit 26 may be able to detect when either one of the proximity switches 20, 22, 24 is turned on.

Figure 2:
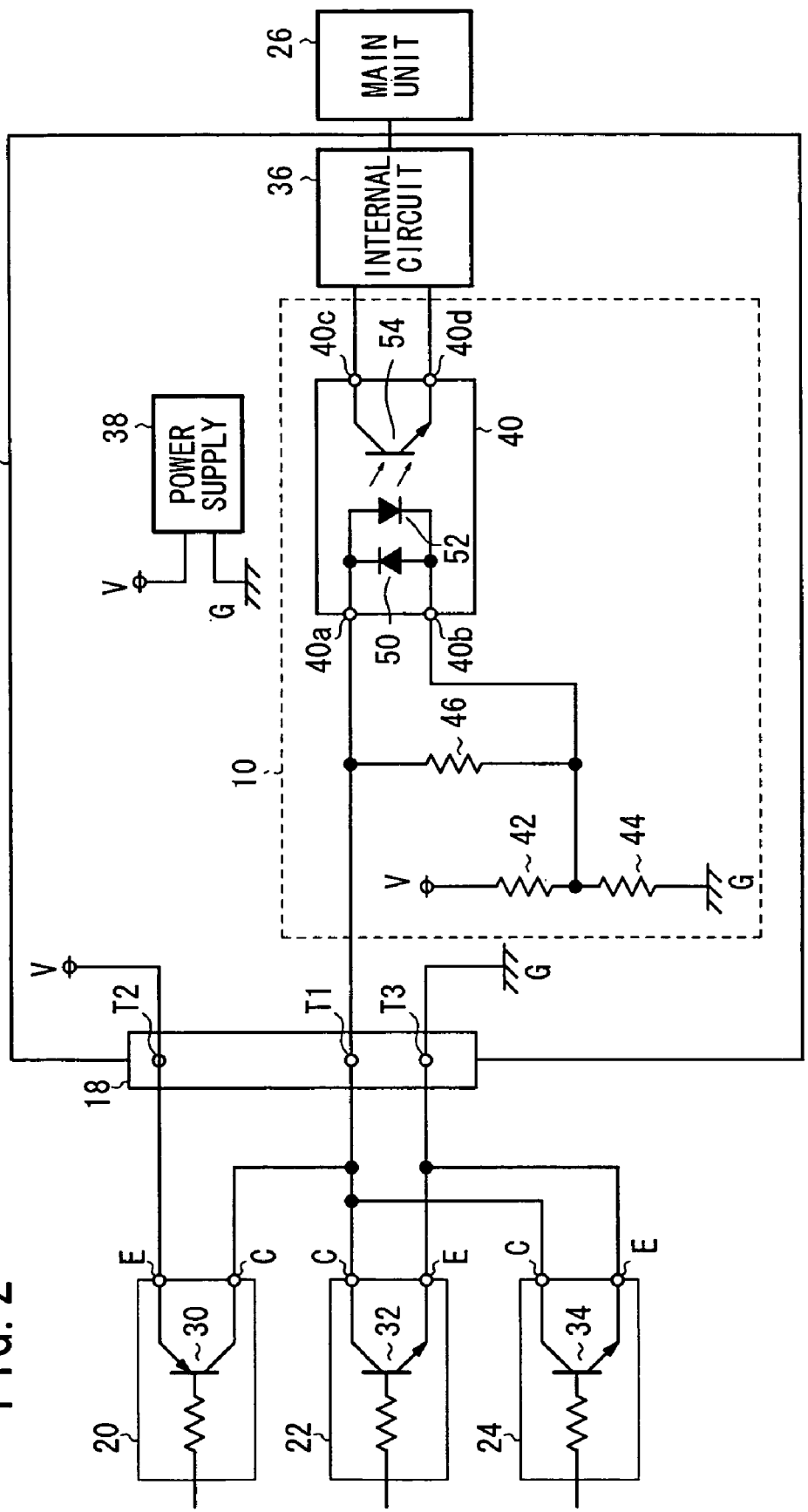
FIG. 2 is a circuit diagram of the input circuit according to the embodiment and proximity switches connected to the input circuit.
Figure 3A:
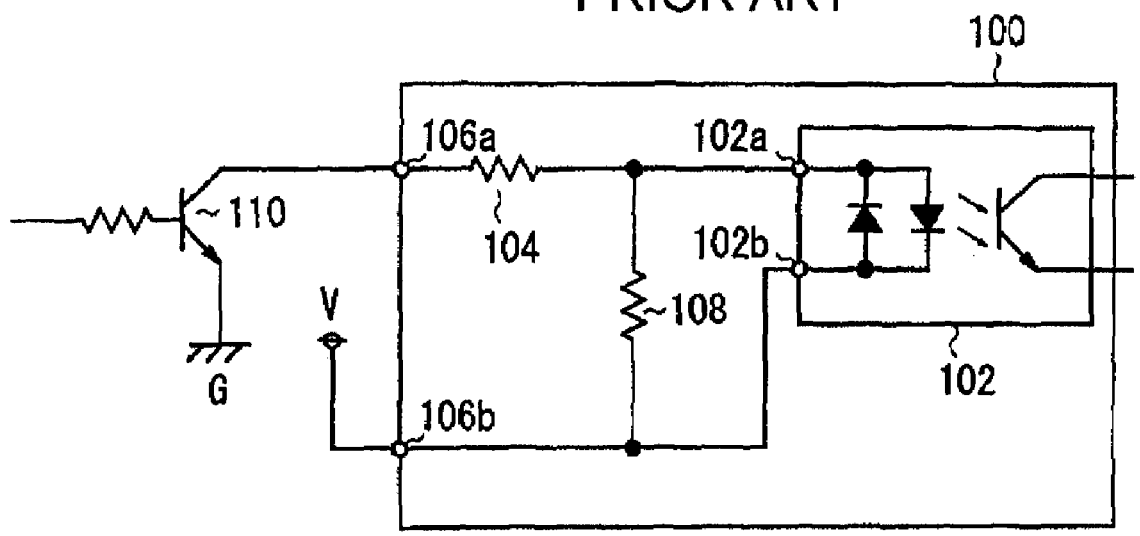
FIG. 3A is a circuit diagram of a conventional input circuit with an NPN transistor connected thereto.
Figure 3B:
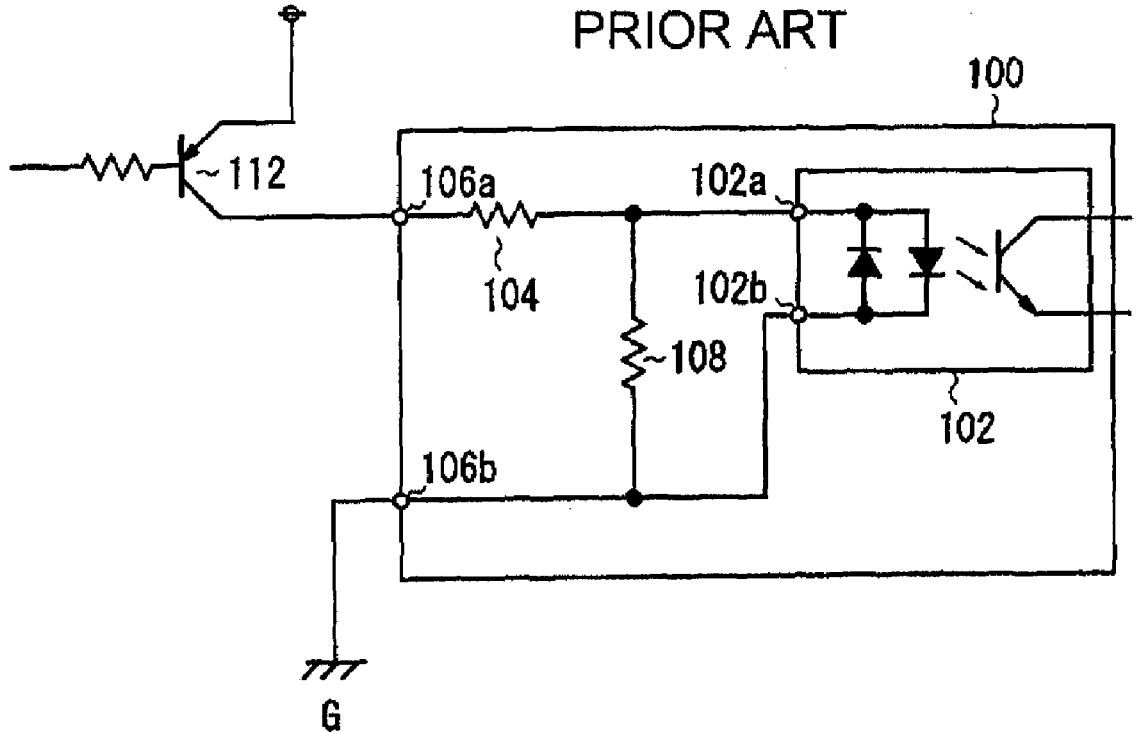
FIG. 3B is a circuit diagram of the conventional input circuit with a PNP transistor connected thereto.

As shown in FIG. 2, the proximity switch 20 has a PNP transistor 30 as an output switching element, and the proximity switches 22, 24 have respective NPN transistors 32, 34 as output switching elements. The transistors 30, 32, 34 are turned on when the workpiece W is located in the respective positions Pa, Pb, Pc, and turned off when the workpiece W is not located in the respective positions Pa, Pb, Pc.

As described above, the proximity switches 20, 22, 24 are positioned such that they will not simultaneously be turned on by the workpiece W. An interlock circuit may additionally be provided to prevent the PNP transistor 30 from being turned on when at least one of the NPN transistors 32, 34 is turned on. Such an interlock circuit is effective to prevent the NPN and PNP switching elements from being simultaneously turned on. NPN switching elements are allowed to be simultaneously turned on, and PNP switching elements are allowed to be simultaneously turned on.

The input unit 14 is connected to the proximity switches 20, 22, 24 through a first external terminal T1 of the connector 18. The input circuit 10 performs an input process on detected signals from the proximity switches 20, 22, 24. An internal circuit 36 converts a signal from the input circuit 10 and transmits the converted signal to the main unit 26. The input unit 14 also includes a power supply 38 having a positive electrode (first polarity electrode) V and a ground electrode (second polarity electrode) G. The connector 18 has second and third external terminals T2, T3 connected respectively to the positive electrode V and the ground electrode G. The positive electrode V is set to a voltage level of +24 V with respect to the ground electrode G. The ground electrode G is set to a voltage level which serves as a reference level for the input circuit 10 only, and may not necessarily be 0 V.

The transistors 30, 32, 34 of the respective proximity switches 20, 22, 24 have respective collectors C connected to the first external terminal T1 of the connector 18. The PNP transistor 30 has an emitter E connected to the positive electrode V through the second external terminal T2, and the NPN transistors 32, 34 have respective emitters E connected to the ground electrode G through the third external terminal T3. Therefore, the transistors 32, 34 are connected to have their emitters E grounded.

The input circuit 10 comprises an AC-input photocoupler 40, a first current-limiting resistor (first resistor) 42, a second current-limiting resistor (second resistor) 44, and a bypass resistor 46.

The photocoupler 40 comprises two LEDs 50, 52 having the same characteristics, and a phototransistor 54 which is turned on when the LED 50 or the LED 52 emits light. The LEDs 50, 52 are connected as a back-to-back circuit with their anodes and cathodes connected parallel in opposite directions. The LEDs 50, 52 are connected between two input terminals 40a, 40b of the photocoupler 40. The phototransistor 54 is connected between two output terminals 40c, 40d of the photocoupler 40.

Currents flowing through the LEDs 50, 52 are limited to appropriate values by the first current-limiting resistor 42 and the second current-limiting resistor 44. Since the LEDs 50, 52 have the same characteristics, the first current-limiting resistor 42 and the second current-limiting resistor 44 have the same resistances, and are arranged as a balanced circuit.

The LEDs 50, 52 are connected in opposite directions between the two input terminals 40a, 40b of the photocoupler 40, a current flowing in either direction can be supplied to the input terminals 40a, 40b. When a current is supplied to the photocoupler 40, either the LED 50 or the LED 52 is energized to emit light, turning on the phototransistor 54. Therefore, the photocoupler 40 can be supplied with input currents of both polarities, i.e., the photocoupler 40 can be supplied with an alternating current.

The input terminal 40a of the photocoupler 40 is connected directly to the first external terminal T1 with no essential resistance therebetween. The other input terminal 40b of the photocoupler 40 is connected to the positive electrode V through the first current-limiting resistor 42 and also to the ground electrode G through the second current-limiting resistor 44. The bypass resistor 46 is connected parallel between the input terminals 40a, 40b.

The output terminals 40c, 40d of the photocoupler 40 are connected to the internal circuit 36, which converts on/off signals of the phototransistor 54 into binary signals and transmits the binary signals to the main unit 26.

Operation of the controller 12 with the input circuit 10 thus constructed for detecting the position of the workpiece W will be described below with reference to FIGS. 1 and 2.

First, the workpiece W is placed in the position Pa on the table 17. At this time, the PNP transistor 30 of the proximity switch 20 is turned on, passing a current through a path from the positive electrode V of the power supply 38 through the second external terminal T2 of the connector 18, the transistor 30, the first external terminal T1 of the connector 18, the input terminal 40a, the LED 52, the input terminal 40b, and the second current-limiting resistor 44, to the ground electrode G. Therefore, the LED 52 is energized to emit light, turning on the phototransistor 54. The main unit 26 can now confirm that the workpiece W is placed in the position Pa.

The main unit 26 then controls the cylinder 16 to start displacing the workpiece W on the table 17. The workpiece W is pushed by the piston rod 16a of the cylinder 16, and displaced away from the position Pa. The PNP transistor 30 of the proximity switch 20 is turned off. At this time, the transistors 32, 34 are also turned off, and the LEDs 50, 52 of the photocoupler 40 are de-energized. The phototransistor 54 is turned off, allowing the main unit 26 to confirm that the workpiece W starts being displaced.

When the workpiece W is further pushed to the position Pb, the NPN transistor 32 of the proximity switch 22 is turned on, passing a current through a path from the positive electrode V of the power supply 38 through the first current-limiting resistor 42, the input terminal 40b, the LED 50, the input terminal 40a, the first external terminal T1 of the connector 18, the transistor 32, and the third external terminal T3 of the connector 18, to the ground electrode G. Therefore, the LED 50 is energized to emit light, turning on the phototransistor 54. The main unit 26 can now confirm that the workpiece W is displaced to the position Pb.

When the workpiece W is further pushed away from the position Pb, the transistors 30, 32, 34 are turned off, turning off the phototransistor 54 again.

When the workpiece W is further pushed to the position Pc, the NPN transistor 34 of the proximity switch 24 is turned on, passing a current through a path from the positive electrode V of the power supply 38 through the first current-limiting resistor 42, the input terminal 40b, the LED 50, the input terminal 40a, the first external terminal T1 of the connector 18, the transistor 34, and the third external terminal T3 of the connector 18, to the ground electrode G. Therefore, the LED 50 is energized to emit light, turning on the phototransistor 54. The main unit 26 can now confirm that the workpiece W is displaced to the position Pc.

If the current flowing in or out from the first external terminal T1 is very small, e.g., if it is 1 mA or less, then the current flows through the bypass resistor 46, and no current flows through either the LED 50 or the LED 52. In this case, the phototransistor 54 is reliably turned off.

If the current flowing in or out from the first external terminal T1 is larger than a predetermined value, e.g., 5 mA, the current flows through the bypass resistor 46 and the LED 50 or the LED 52. In this case, the phototransistor 54 is reliably turned on.

The input circuit 10 according to the present embodiment thus allows both the proximity switch 20 having the PNP transistor 30 as the switching element and the proximity switches 22, 24 having the NPN transistors 32, 34 as the switching elements to be simultaneously connected and operated.

More proximity switches than the illustrated proximity switches 20, 22, 24 may be connected to the input circuit 10. The switching elements used in the additional proximity switches may comprise a mixture of NPN and PNP transistors, or may comprise transistors of one type, i.e., NPN or PNP transistors.

Alternatively, a single PNP or NPN transistor may be connected to the input circuit 10.

Regardless of the number of connected proximity switches, since the collectors C of the transistors of the proximity switches are connected in common to the first external terminal T1, the connector 18 is not required to have an increased number of terminals or an increased number of connectors 18 do not need to be connected. As the connector 18 has the second external terminal T2 connected to the positive electrode V and the third external terminal T3 connected to the ground electrode G, no additional power supply connectors do not need to be provided for use with the proximity switches 20, 22, 24.

The input circuit 10 is of a simple arrangement made up of the photocoupler 40, the first current-limiting resistor 42, the second current-limiting resistor 44, and the bypass resistor 46. Because the input circuit 10 comprises a small number of components, it may be installed on a small mount area on the circuit board of the input unit 14. The components of the input circuit 10 are general-purpose components, allowing the input circuit 10 to be constructed inexpensively.

If the power supply 38 comprises an insulative power supply, then the input circuit 10 and the internal circuit 36 may be insulated from each other. Specifically, since the photocoupler 40 energizes the phototransistor 54 with light emitted from the LED 50 or 52, it electrically insulates the input circuit 10 and the internal circuit 36 from each other. The power supply 38 may be an external power supply, i.e., a 12-V external power supply, which meets the power specifications of the proximity switches 20, 22, 24, separately from the controller 12. In this case, the first current-limiting resistor 42 and the second current-limiting resistor 44 may be replaced with those having resistances that match the voltage of the external power supply 38.

The photocoupler 40, the first current-limiting resistor 42, the second current-limiting resistor 44, and the bypass resistor 46 may be combined in a single package. The photocoupler 40 is not limited to the transistor output type, but may be of a Darlington configuration, a photodiode type, or an IC output type.

The switching elements employed in the proximity switches 20, 22, 24 have been described above as the PNP transistor 30 and the NPN transistors 32, 34. However, PNP and NPN FETs (Field Effect Transistors) may also be employed as switching elements in the proximity switches 20, 22, 24 for use with the input circuit 10.

The proximity switches 20, 22, 24 have been described as being connected to the input circuit 10. However, various sensors such as pressure switches, flow rate switches, etc. may be connected to the input circuit 10.

As described above, the input circuit 10 according to the present embodiment allows both the PNP transistor 30 and the NPN transistors 32, 34 to be connected simultaneously as switching elements to the first external terminal T1. The input circuit 10 is of a simple arrangement made up of the first external terminal T1, the AC-input photocoupler 40, the first current-limiting resistor 42, and the second current-limiting resistor 44.

Although a certain preferred embodiment of the present invention has been shown and described in detail, it should be understood that various changes and modifications may be ade therein without departing from the scope of the appended claims.

What is claimed is:

1. An input circuit comprising:
   a first external terminal for connection to at least two switching elements comprising a PNP switching element and an NPN switching element respectively;
   a first resistor and a second resistor; and
   a photocoupler having a first input terminal and a second input terminal for receiving an AC input;
   said first input terminal being connected to said first external terminal;
   said second input terminal being connected to a first polarity electrode of a power supply through said first resistor and to a second polarity electrode of the power supply through said second resistor.

2. An input circuit according to claim 1, wherein said first input terminal is connected to respective collectors of said PNP switching element and said NPN switching element, and further comprising:
   a second external terminal connected to an emitter of said PNP switching element and a third external terminal connected to an emitter of said NPN switching element;
   said first polarity electrode of the power supply being connected to said second external terminal;
   said second polarity electrode of the power supply being connected to said third external terminal.

3. An input circuit according to claim 1, wherein said first resistor and said second resistor have respective resistances equal to each other.

4. An input circuit according to claim 1, wherein said power supply comprises an insulative power supply.

5. An input circuit according to claim 1, further comprising:
   a bypass resistor connected between said first input terminal and said second input terminal.

6. An input circuit according to claim 1, wherein said photocoupler comprises two LEDs having respective anodes and cathodes connected parallel in opposite directions.

7. An input circuit according to claim 1, wherein said input circuit is incorporated in an input unit of a controller.

8. An input circuit according to claim 1, wherein said first external terminal is connected to at least one proximity switch as said switching element.

* * * * *